United States Patent
Kim et al.

(10) Patent No.: US 11,119,157 B2
(45) Date of Patent: Sep. 14, 2021

(54) METHOD, APPARATUS AND RECORDING MEDIUM FOR ESTIMATING PARAMETERS OF BATTERY EQUIVALENT CIRCUIT MODEL

(71) Applicant: LG CHEM, LTD., Seoul (KR)

(72) Inventors: Young-Jin Kim, Daejeon (KR); Sun-Young Cha, Daejeon (KR)

(73) Assignee: LG Chem, Ltd., Seoul (KR)

(*) Notice: Subject to any disclaimer, the term of this patent is extended or adjusted under 35 U.S.C. 154(b) by 91 days.

(21) Appl. No.: 16/610,208

(22) PCT Filed: Nov. 10, 2018

(86) PCT No.: PCT/KR2018/011988
§ 371 (c)(1),
(2) Date: Nov. 1, 2019

(87) PCT Pub. No.: WO2019/088492
PCT Pub. Date: May 9, 2019

(65) Prior Publication Data
US 2021/0165046 A1    Jun. 3, 2021

(30) Foreign Application Priority Data
Nov. 2, 2017 (KR) .................. 10-2017-0145440

(51) Int. Cl.
*G01R 31/367* (2019.01)
*G01R 31/389* (2019.01)

(52) U.S. Cl.
CPC ......... *G01R 31/367* (2019.01); *G01R 31/389* (2019.01)

(58) Field of Classification Search
None
See application file for complete search history.

(56) References Cited

U.S. PATENT DOCUMENTS 6,160,382 A * 12/2000 Yoon .................. G01R 31/389
                                                        320/136
2007/0252601 A1    11/2007 Satoh et al.
(Continued)

FOREIGN PATENT DOCUMENTS

CN    102253342 A    11/2011
CN    105186590 A *  12/2015
(Continued)

OTHER PUBLICATIONS

Dahmane et al., "A Proposed Pulses Current Method to Extract the Batteries Parameters" Proceedings of the 6th International Conference on Systems and Control, University of Batna 2, Batna, Algeria, May 7-9, 2017 (Year: 2017).*
(Continued)

*Primary Examiner* — John C Kuan
(74) *Attorney, Agent, or Firm* — Morgan, Lewis & Bockius LLP

(57) ABSTRACT

Disclosed is a method and apparatus for estimating parameters of a battery equivalent circuit model. The battery equivalent circuit model includes a first and second resistors and a capacitor. The method includes reading a pulse discharge profile corresponding to a parameter estimation condition from a plurality of pre-stored pulse discharge profiles, the pulse discharge profile including a first number of terminal voltages sequentially measured from a battery having a specific SOC in a predetermined cycle while the battery is discharged with a specific constant current from an OCV corresponding to the specific SOC to a lower limit of discharge voltage at a specific temperature, extracting a second number of terminal voltages between the OCV and a threshold voltage from the first number of terminal voltages, and estimating resistance values of the first and second
(Continued)

resistors based on the OCV, the constant current, and the second number of terminal voltages.

7 Claims, 8 Drawing Sheets

(56) References Cited

U.S. PATENT DOCUMENTS

| | | |
|---|---|---|
| 2011/0109273 A1 | 5/2011 | Tamezane |
| 2011/0224928 A1 | 9/2011 | Lin et al. |
| 2012/0215517 A1 | 8/2012 | Bohlen et al. |
| 2013/0116954 A1 | 5/2013 | Tazoe et al. |
| 2013/0166235 A1 | 6/2013 | Oh et al. |
| 2014/0115858 A1 | 5/2014 | Pisu et al. |
| 2014/0340045 A1 | 11/2014 | Itabashi et al. |
| 2015/0100260 A1 | 4/2015 | Joe et al. |
| 2016/0064972 A1* | 3/2016 | Stefanopoulou ..... G01R 31/387 320/116 |
| 2019/0064276 A1 | 2/2019 | Kawai et al. |

FOREIGN PATENT DOCUMENTS

| | | |
|---|---|---|
| CN | 106896273 A | 6/2017 |
| EP | 3 623 829 A1 | 3/2020 |
| JP | 2003-157912 A | 5/2003 |
| JP | 2008-243921 A | 10/2008 |
| JP | 2010-8133 A | 1/2010 |
| JP | 4646194 B2 | 3/2011 |
| JP | 2011-103748 A | 5/2011 |
| JP | 2012-159414 A1 | 8/2012 |
| JP | 2015-210182 A | 11/2015 |
| JP | 2017-067790 A | 4/2017 |
| JP | 2017-138128 A | 8/2017 |
| KR | 10-2012-0095878 A | 8/2012 |
| KR | 10-2013-0060623 A | 6/2013 |
| KR | 10-2013-0119871 A | 11/2013 |
| KR | 10-2017-0057791 A | 5/2017 |
| KR | 10-2017-0111746 A | 10/2017 |

OTHER PUBLICATIONS

Hentunen et al., "Time-Domain Parameter Extraction Method for Thevenin-Equivalent Circuit Battery Models" IEEE Transactions On Energy Conversion, vol. 29, No. 3, Sep. 2014 (Year: 2014).*
International Search Report issued in corresponding International Patent Application No. PCT/KR2018/011988, dated Jan. 21, 2019.
Office Action dated Jul. 20, 2020, issued in corresponding Korean Patent Application No. 10-2017-0145440.
Office Action dated Oct. 6, 2020, issued in corresponding Japanese Patent Application No. 2019-555938.
Extended European Search Report dated Jun. 25, 2020, issued in corresponding EP Patent Application No. 18872015.5.
Office Action dated Mar. 29, 2021, issued in corresponding Chinese Patent Application No. 201880026557.9.

* cited by examiner

METHOD, APPARATUS AND RECORDING MEDIUM FOR ESTIMATING PARAMETERS OF BATTERY EQUIVALENT CIRCUIT MODEL

TECHNICAL FIELD

The present disclosure relates to a method, apparatus and recording medium for estimating parameters of a battery equivalent circuit model.

The present application claims priority to Korean Patent Application No. 10-2017-0145440 filed in the Republic of Korea on Nov. 2, 2017, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

To control a battery more safely and efficiently, most of all, it is important to accurately estimate the state of charge (SOC) of the battery. One of battery SOC estimation techniques is ampere counting (also known as a current integration method). The ampere counting estimates the SOC of the battery from the time-sequentially accumulated result of the battery current periodically measured by a current sensor. However, precision of the current sensor itself or noise from the outside makes a difference between the battery current measured by the current sensor and the real battery current, and a difference between the estimated SOC and the actual SOC increases over time.

Another SOC estimation method for solving the above-described problem is the extended kalman filter (EKF). In general, the extended Kalman filter improves accuracy of estimated SOC using a battery equivalent circuit model together with ampere counting. To this end, when running the extended Kalman filter, the parameters of the battery equivalent circuit model are periodically updated from a given parameter map based on measured battery voltage, measured battery current and/or measured battery temperature.

The conventional parameter map is obtained through a data fitting process for each of a plurality of pulse discharge profiles recorded through constant current discharge testing conducted on a battery in various conditions.

Each pulse discharge profile reflects a linear change range in which the linear voltage characteristics of the battery are found as well as a nonlinear change range in which the nonlinear voltage characteristics are found. However, the battery equivalent circuit model is suitable to simulate the linear voltage characteristics of the battery, but is not suitable to simulate the nonlinear voltage characteristics. As a result, in a situation in which nonlinear characteristics are dominantly found, accuracy of SOC estimated from the extended Kalman filter may be rather lower than SOC estimated from ampere counting alone in certain instances.

DISCLOSURE

Technical Problem

The present disclosure is designed to solve the problems such as those described above, and therefore the present disclosure is directed to providing a method and apparatus that extracts a linear change range from a pulse discharge profile to the exclusion of a nonlinear change range, and estimates the parameters of a battery equivalent circuit model based on data related to the extracted linear change range.

These and other objects and advantages of the present disclosure can be understood by the following description and will be apparent from the embodiments of the present disclosure. Further, it will be readily understood that the objects and advantages of the present disclosure can be realized by the means set forth in the appended claims and combinations thereof.

Technical Solution

Various embodiments of the present disclosure for achieving the above-described object are as follows.

A method according to an embodiment of the present disclosure is for estimating parameters of a battery equivalent circuit model including a first resistor, a second resistor connected in series to the first resistor and a capacitor connected in parallel to the second resistor. The method includes setting a parameter estimation condition including a specific temperature, a specific state of charge (SOC) and a specific constant current, reading a pulse discharge profile corresponding to the parameter estimation condition from a plurality of pre-stored pulse discharge profiles, wherein the pulse discharge profile includes a first number of terminal voltages sequentially measured from a battery having the specific SOC in a predetermined cycle while the battery is discharged with the specific constant current from an open-circuit voltage (OCV) corresponding to the specific SOC to a lower limit of discharge voltage at the specific temperature, determining a threshold voltage between the OCV and the lower limit of discharge voltage from the discharge voltage profile, extracting a second number of terminal voltages between the OCV and the threshold voltage from the first number of terminal voltages, and estimating a resistance value of the first resistor and a resistance value of the second resistor based on the OCV, the constant current and the second number of terminal voltages.

Estimating the resistance value of the first resistor and the resistance value of the second resistor may include estimating the resistance value of the first resistor and the resistance value of the second resistor based on the OCV, the specific constant current and the second number of terminal voltages, using a least square algorithm.

The method may further include determining capacitance of the capacitor based on a time constant and the estimated resistance value of the second resistor.

The method may further include associating the estimated resistance value of the first resistor and the estimated resistance value of the second resistor with the specific temperature, the specific SOC and the specific constant current, and recording the same in a parameter map.

A recording medium according to another embodiment of the present disclosure has recorded thereon a program for performing the above-described method in a computer.

An apparatus according to still another embodiment of the present disclosure is for estimating parameters of a battery equivalent circuit model including a first resistor, a second resistor connected in series to the first resistor and a capacitor connected in parallel to the second resistor. The apparatus includes a memory configured to store a plurality of pulse discharge profiles, and a control unit operably coupled to the memory. The control unit is configured to set a parameter estimation condition including a specific temperature, a specific SOC and a specific constant current. The control unit is configured to read a pulse discharge profile corresponding to the parameter estimation condition from the plurality of pulse discharge profiles, wherein the pulse discharge profile includes a first number of terminal voltages sequentially measured from a battery having the specific SOC in a predetermined cycle while the battery is discharged with the specific constant current from an OCV corresponding to the specific SOC to a lower limit of discharge voltage at the specific temperature. The control unit is configured to determine a threshold voltage between the OCV and the lower limit of discharge voltage from the pulse discharge profile. The control unit is configured to extract a second number of terminal voltages between the OCV and the threshold voltage from the first number of terminal voltages, and estimate a resistance value of the first resistor and a resistance value of the second resistor based on the OCV, the constant current and the second number of terminal voltages.

The control unit may be further configured to estimate the resistance value of the first resistor and the resistance value of the second resistor based on the OCV, the specific constant current and the second number of terminal voltages, using a least square algorithm.

Advantageous Effects

According to at least one of the embodiments of the present disclosure, it is possible to extract a linear change range from a pulse discharge profile to the exclusion of a nonlinear change range, and estimate the parameters of a battery equivalent circuit model based on data related to the extracted linear change range.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

Figure 6:
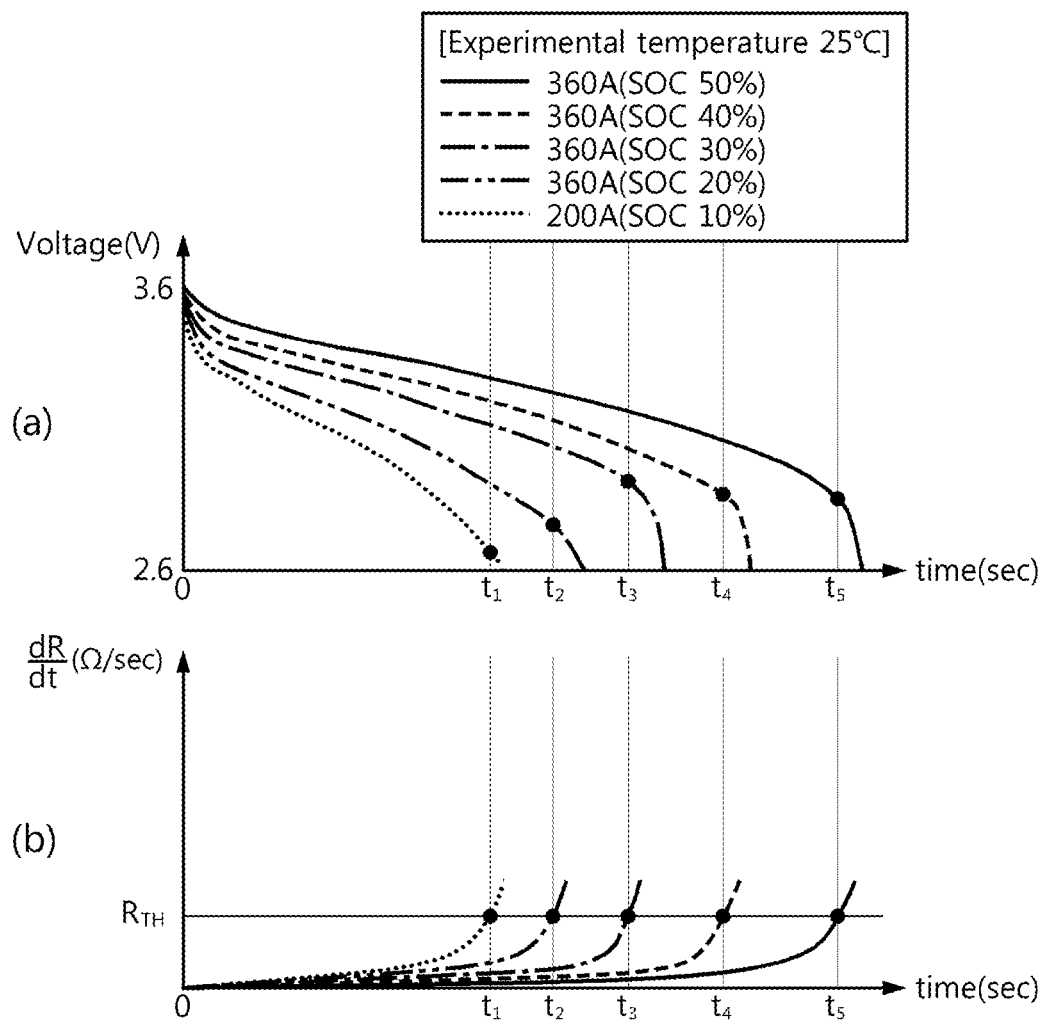

(a) of FIG. 6 is a graph showing pulse discharge profiles obtained through pulse discharge testing of six batteries with the same maximum capacity of 36 Ah and different SOCs of 10%, 20%, 30%, 40% and 50% while maintaining the temperature at 25° C., and (b) of FIG. 6 is a graph showing resistance variation profiles obtained from the pulse discharge profiles shown in (a) of FIG. 6.

Figure 7:
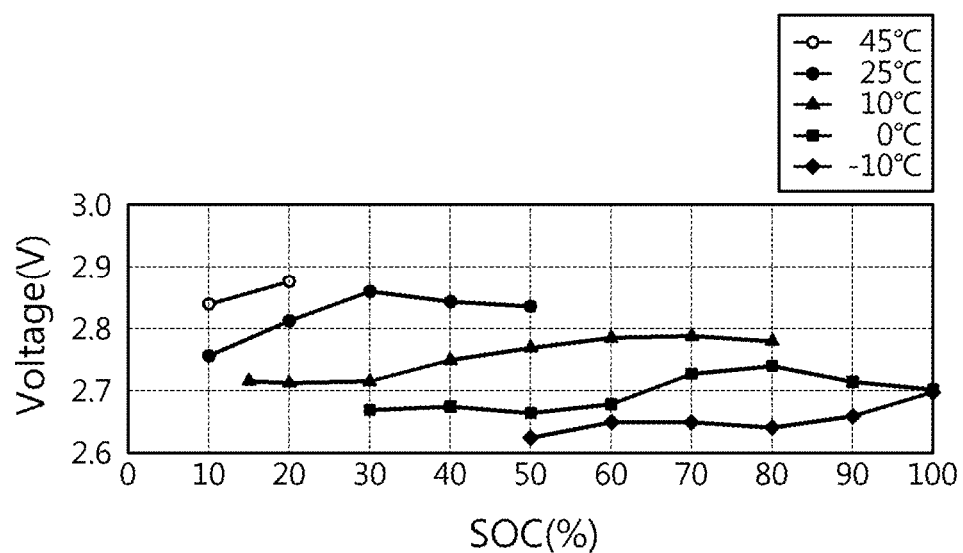

FIG. 7 is a graph showing candidate voltage values determined based on pulse discharge profiles and resistance variation profiles obtained in various temperature conditions.

Figure 8:
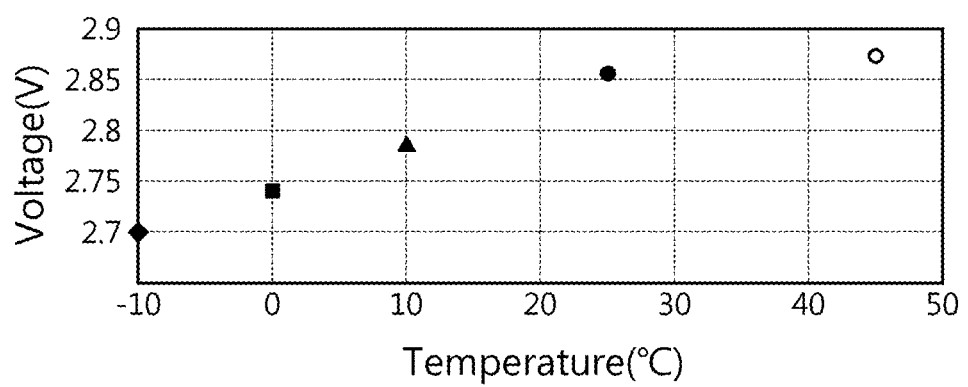

FIG. 8 is a graph showing changes in threshold voltage with changes in temperature condition.

MODE FOR CARRYING OUT THE INVENTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
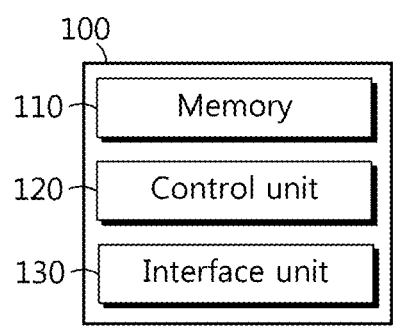
FIG. 1 is a schematic block diagram showing configuration of an apparatus for estimating parameters of a battery equivalent circuit model according to an embodiment of the present disclosure.

FIG. 1 is a schematic block diagram showing configuration of an apparatus 100 for estimating parameters of a battery equivalent circuit model according to an embodiment of the present disclosure.

Referring to FIG. 1, the apparatus 100 includes a memory 110, a control unit 120 and an interface unit 130, and estimates the parameters of a battery equivalent circuit model for a battery.

The memory 110 is not limited to a particular type, and includes any storage media capable of recording and erasing information. In an example, the memory 110 may be RAM, ROM, register, hard disk, optical recording media or magnetic recording media.

The memory 110 may be connected to the control unit 120, for example, through a data bus, to allow the control unit 120 to access the memory 110. The memory 110 stores and/or updates and/or erases and/or transmits programs including various types of control logics executed by the control unit 120 and/or data created when the control logics are executed. The memory 110 may be logically split into two or more, and may be included in the control unit 120, but is not limited thereto.

The control unit 120 may selectively include a processor, an application-specific integrated circuit (ASIC), a chipset, a logic circuit, a register, a communication modem and a data processing device known in the art to execute the above-described various control logics. Additionally, when the control logics are implemented in software, the control unit 120 may be implemented as a set of program modules. The operation of the control unit 120 will be described with reference to FIG. 3 below.

The interface unit 130 is configured to communicate with an external device (e.g., an ECU of an electric vehicle, an operator terminal, etc.) through a communication channel. The communication channel supports wired or wireless communication. The wired communication may be, for example, controller area network (CAN) communication, and the wireless communication may be, for example, ZigBee or Bluetooth communication. The interface unit 130 may provide the memory 110 with input data (e.g., a pulse discharge profile as described below) from the external device, and provide the external device with output data representing the result of the control logic executed by the control unit 120.

Figure 2:
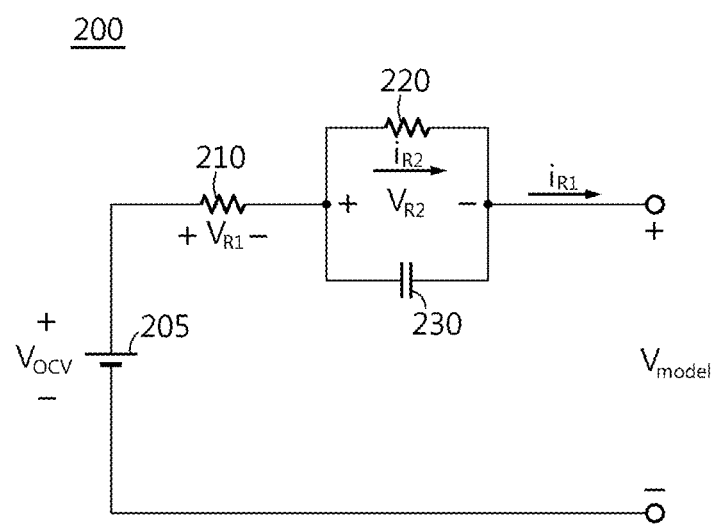
FIG. 2 is an exemplary diagram showing a battery equivalent circuit model of a battery.
Figure 3:
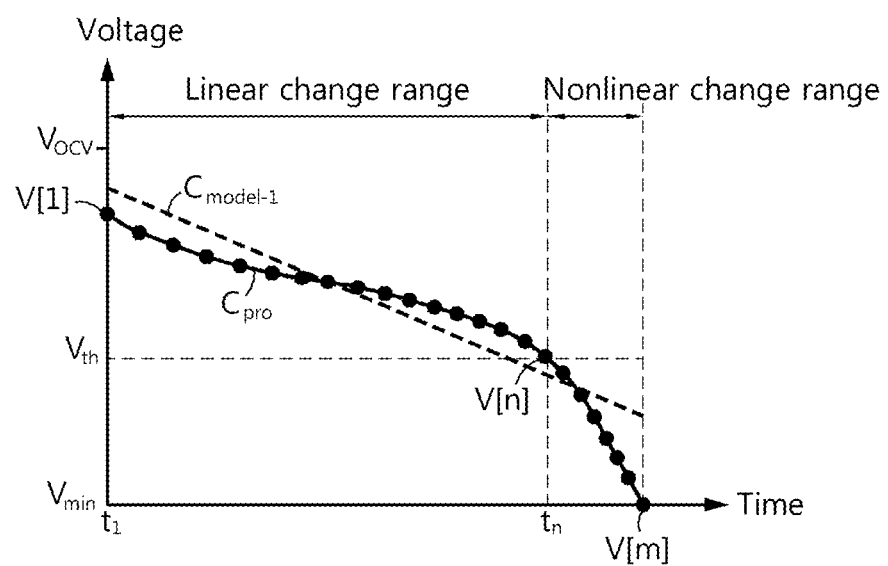
FIG. 3 is a graph showing an exemplary pulse discharge profile illustrating nonlinear voltage characteristics of a battery.

FIG. 2 is an exemplary diagram showing the battery equivalent circuit model 200 of the battery, and FIG. 3 is a graph showing an exemplary pulse discharge profile illustrating the nonlinear voltage characteristics of the battery.

Referring to FIG. 2, the battery equivalent circuit model 200 may include a voltage source 205, a first resistor 210, a second resistor 220 and a capacitor 230. The parameters of the battery equivalent circuit model 200 may include a resistance value of the first resistor 210, a resistance value of the second resistor 220 and capacitance of the capacitor 230.

The voltage source 205 indicates an open-circuit voltage $V_{OCV}$ of the battery determined from the State Of Charge (SOC) and the temperature of the battery. That is, the OCV $V_{OCV}$ is uniquely set when the SOC and temperature are set, and may be expressed as $V_{OCV}=f(SOC, T)$, in which T denotes the temperature of the battery, and f( ) denotes a function that outputs $V_{OCV}$ when SOC and T are inputted.

The OCV formed by the voltage source 205 may be predefined for each SOC and each temperature of the battery. That is, the OCV of the battery may be measured at each of various SOCs and various temperatures, an OCV-SOC map defining a correlation between the SOC, temperature and OCV may be generated from the measured result, and the generated OCV-SOC map may be stored in the memory 110.

The first resistor 210 simulates a voltage drop caused by the internal resistance of the battery. The terminal voltage measured during charge of the battery is higher than the OCV due to the internal resistance. On the contrary, the terminal voltage measured during discharge of the battery is lower than the OCV.

The second resistor 220 and the capacitor 230 are connected in parallel. As shown, the second resistor 220 may be connected to the first resistor 210 in series. A parallel connection circuit of the second resistor 220 and the capacitor 230 may be referred to as an 'RC pair'. The second resistor 220 and the capacitor 230 may simulate a voltage drop caused by polarization of the positive electrode and the negative electrode during charge and discharge of the battery.

In the time step k, when the current flowing in the first resistor 210 is $i_{R1}[k]$, the current flowing in the second resistor 220 is $i_{R2}[k]$, the resistance value of the first resistor 210 is $R_1$ and the resistance value of the second resistor 220 is $R_2$, the voltage $V_{model}[k]$ of the battery equivalent circuit model 200 may be expressed as below.

$$V_{model}[k]=V_{ocv}-(V_{R1}[k]+V_{R2}[k])=V_{ocv}-(i_{R1}[k]R_1+i_{R2}[k]R_2)=V_{ocv}-V_{mod\_d}[k]$$

Here, the voltage drop by the first resistor 210 and the second resistor 220 is expressed by $V_{mod\_d}[k]$.

Meanwhile, when the amount of voltage drop caused by the polarization of the battery exceeds a predetermined level, the battery equivalent circuit model 200 cannot effectively simulate the actual voltage behavior of the battery any longer, and its detailed description will be provided with reference to FIG. 3.

When the battery has a specific temperature (e.g., 25° C.) and a specific SOC (e.g., SOC 20%), the pulse discharge profile $C_{pro}$ shown in FIG. 3 may be defined by a first number of terminal voltages V[1]~V[m] sequentially measured from the battery in a predetermined cycle during discharge of the battery with a specific constant current (e.g., 360 A) from the OCV corresponding to the specific temperature and the specific SOC to the lower limit of discharge voltage $V_{min}$. That is, the pulse discharge profile $C_{pro}$ includes the first number of terminal voltages V[1]~V[m].

The pulse discharge profile $C_{pro}$ is divided into two different ranges, i.e., a range (referred to as a 'linear change range') in which linear voltage characteristics are found and a range (referred to as a 'nonlinear change range') in which nonlinear voltage characteristics are found, based on a terminal voltage (hereinafter referred to as 'threshold voltage') $V_{th}$ at a specific point on the pulse discharge profile $C_{pro}$. That is, among the first number of terminal voltages V[1]~V[m], the voltage range of terminal voltages equal to or higher than the threshold voltage $V_{th}$ may be regarded as being time-varying linear, while the voltage range of terminal voltages less than the threshold voltage $V_{th}$ may be regarded as being time-varying nonlinear. The nonlinear voltage characteristics of the battery found in the pulse discharge profile $C_{pro}$ result from a nonlinearly increasing voltage drop caused by the polarization of the battery during continuous constant current discharge.

The battery equivalent circuit model voltage curve $C_{model\_1}$ shown in FIG. 3 may be generated using the parameters of the battery equivalent circuit model 200 estimated based on the first number of terminal voltages V[1]~V[m] included in the pulse discharge profile $C_{pro}$. FIG. 3 shows the fact that the battery equivalent circuit model voltage curve $C_{model\_1}$ has a larger difference from the pulse discharge profile $C_{pro}$ in most of the remaining range except an intersection point with the pulse discharge profile $C_{pro}$. This is because even the terminal voltages V[n+1]~V

[m] in the range having nonlinear voltage characteristics that the battery equivalent circuit model 200 cannot accurately simulate are used to estimate the parameters of the battery equivalent circuit model 200.

Figure 4:
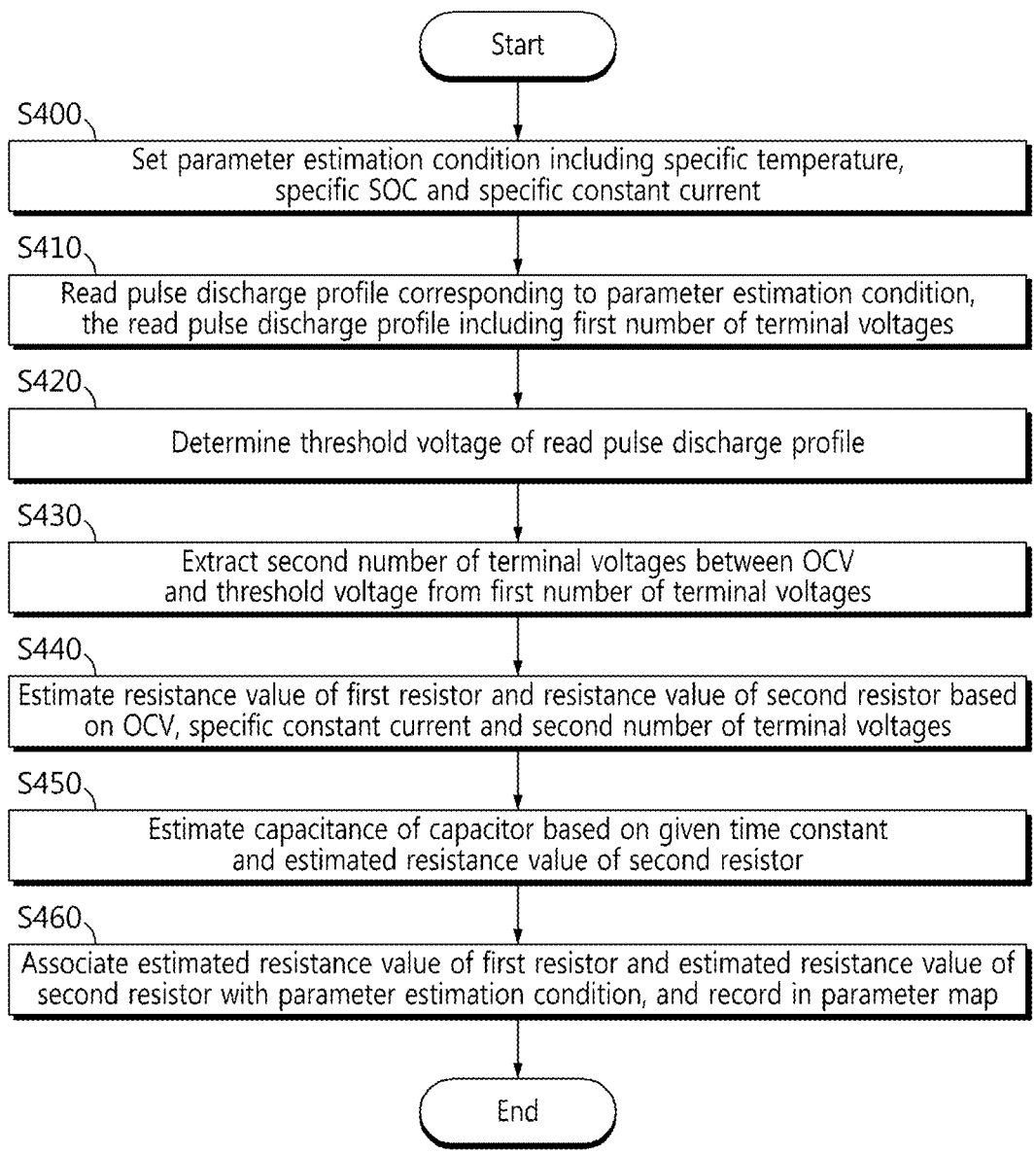
FIG. 4 is a flowchart of a method for estimating parameters of a battery equivalent circuit model according to an embodiment of the present disclosure.
Figure 5:
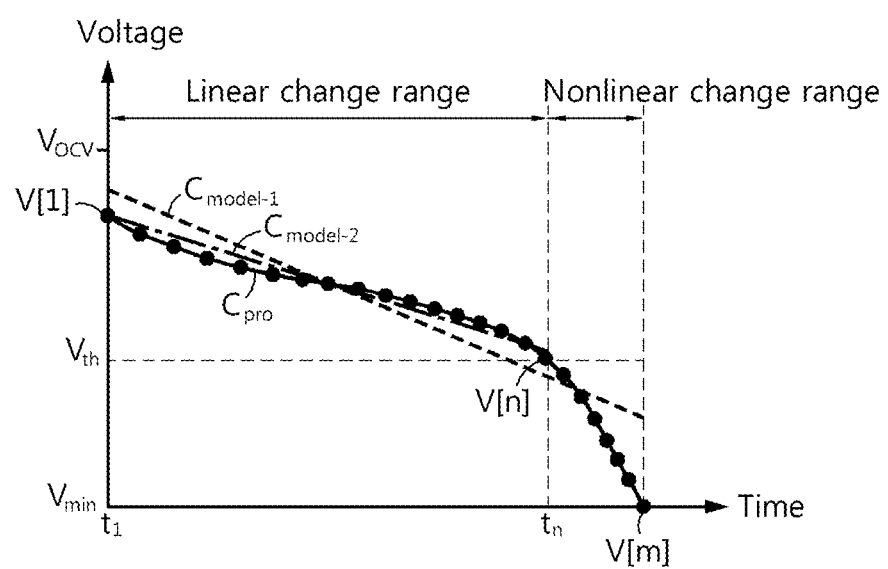
FIG. 5 is a graph showing a battery equivalent circuit model voltage curve generated using battery equivalent circuit model parameters estimated by the method of FIG. 4.

The apparatus 100 may extract a second number of terminal voltages V[1]~V[n] belonging to the range having linear voltage characteristics based on the threshold voltage $V_{th}$ associated with the specific temperature, the specific SOC and the specific constant current, and estimate the parameters of the battery equivalent circuit model 200 based on the second number of terminal voltages V[1]~V[n], and a detailed description will be provided with reference to FIGS. 4 and 5.

FIG. 4 is a flowchart of a method for estimating the parameters of the battery equivalent circuit model according to an embodiment of the present disclosure, and FIG. 5 is a graph showing the battery equivalent circuit model voltage curve generated using the battery equivalent circuit model parameters estimated by the method of FIG. 4.

Referring to FIGS. 1 to 3 together with FIG. 4, in step S400, the control unit 120 sets a parameter estimation condition including a specific temperature, a specific SOC and a specific constant current. The specific temperature, the specific SOC and the specific constant current may be a combination of selected ones from each of a plurality of given temperatures, a plurality of given SOCs and a plurality of given constant currents.

In step S410, the control unit 120 reads a pulse discharge profile $C_{pro}$ corresponding to the parameter estimation condition from the memory 110. A plurality of pulse discharge profiles associated with the plurality of temperatures, the plurality of SOCs and the plurality of constant currents one-to-one may be pre-recorded in the memory 110. The read pulse discharge profile $C_{pro}$ includes a first number of terminal voltages V[1]~V[m] sequentially measured from the battery in a predetermined cycle while the battery having the specific SOC is discharged with the constant current from OCV $V_{ocv}$ corresponding to the specific SOC to the lower limit of discharge voltage $V_{min}$ at the specific temperature.

In step S420, the control unit 120 determines a threshold voltage $V_{th}$ from the pulse discharge profile read in step S410. The threshold voltage $V_{th}$ is between the OCV $V_{ocv}$ and the lower limit of discharge voltage $V_{min}$ as described above. The method of determining the threshold voltage $V_{th}$ will be described in more detail with reference to FIGS. 6 to 8 below.

In step S430, the control unit 120 extracts a second number of terminal voltages V[1]~V[n] between the OCV and the threshold voltage from the first number of terminal voltages V[1]~V[m]. That is, the control unit 120 may remove terminal voltages V[n+1]~V[m] belonging to the range having nonlinear voltage characteristics from all the terminal voltages V[1]~V[m] included in the pulse discharge profile $C_{pro}$, and extract only terminal voltages V[1]~V[n] belonging to the range having linear voltage characteristics. In this instance, it will be easily understood by those skilled in the art that the second number n is smaller than the first number m.

The second number of terminal voltages V[1]~V[n] may be each expressed as V[k]=$v_{ocv}$-$V_d$[k] {k=1~n}, and from this, it can be seen that $V_d$[k]=$v_{ocv}$-V[k] {k=1~n}.

Here, $V_d$[k] is a value obtained by subtracting the terminal voltage V[k] of $k^{th}$ cycle (i.e., time step k) from the OCV $V_{ocv}$, and is the actual voltage drop of the battery. A difference between the $V_{mod\_d}$[k] and the $V_d$[k] may be determined by a resistance value of the first resistor 210 and a resistance value of the second resistor 220.

In step S440, the control unit 120 estimates a resistance value of the first resistor 210 and a resistance value of the second resistor 220 based on the OCV $V_{ocv}$, the specific constant current and the second number of terminal voltages V[1]~V[n]. The control unit 120 may use the least square algorithm to estimate the resistance value of the first resistor 210 and the resistance value of the second resistor 220.

When k=1~n, the sum S of squared difference between the $V_{mod\_d}$[k] and the $V_d$[k] may be expressed as below.

$$S = \sum_{k=1}^{n} (V_{mod\_d}[k] - V_d[k])^2$$

The resistance value of the first resistor 210 and the resistance value of the second resistor 220 that minimize the sum S of squares may be estimated using the following Equation 1.

$$\beta = \begin{bmatrix} R_1 \\ R_2 \end{bmatrix} = (I^T I)^{-1} I^T V \quad <\text{Equation 1}>$$

In Equation 1, $I = [\, I_{R1} \quad I_{R2} \,]$, $$I_{R1} = \begin{bmatrix} i_{R1}[1] \\ i_{R1}[2] \\ \vdots \\ i_{R1}[n] \end{bmatrix} = \begin{bmatrix} i_{const} \\ i_{const} \\ \vdots \\ i_{const} \end{bmatrix},$$

$$I_{R2} = \begin{bmatrix} i_{R2}[1] \\ i_{R2}[2] \\ \vdots \\ i_{R2}[n] \end{bmatrix},$$

$$V = \begin{bmatrix} V_d[1] \\ V_d[2] \\ \vdots \\ V_d[n] \end{bmatrix} = \begin{bmatrix} V_{ocv} - V[1] \\ V_{ocv} - V[2] \\ \vdots \\ V_{ocv} - V[n] \end{bmatrix},$$

$i_{R2}[k+1] = \exp\left(-\frac{\Delta t}{\tau}\right) i_{R2}[k] + \left\{1 - \exp\left(-\frac{\Delta t}{\tau}\right)\right\} i_{const}$ and $i_{R2}[0] = 0$.

Additionally, $V_d$[k] is the value obtained by subtracting the terminal voltage V[k] in the $k^{th}$ cycle (i.e., time step k) from the OCV $V_{ocv}$, $i_{R1}$[k] is the current flowing in the first resistor 210 in the $k^{th}$ cycle, $i_{const}$ is the specific constant current, $i_{R2}$[k] is the current flowing in the second resistor 220 in the $k^{th}$ cycle, τ is a given time constant for the second resistor 220 and the capacitor 230, Δt is the time interval of the cycle, $R_1$ is the estimated resistance value of the first resistor 210, $R_2$ is the estimated resistance value of the second resistor 220, and $I^T$ is the transposed matrix of I.

FIG. 5 is a graph in which a battery equivalent circuit model voltage curve $C_{model\_2}$ is added to the graph of FIG. 3. The battery equivalent circuit model voltage curve $C_{model\_2}$ is generated based on the estimated resistance value $R_1$ of the first resistor 210 and the estimated resistance value $R_2$ of the second resistor 220. It can be seen that when comparing with the battery equivalent circuit model voltage curve $C_{model\_1}$, the battery equivalent circuit model voltage curve $C_{model\_2}$ simulates the pulse discharge profile $C_{pro}$ better than the battery equivalent circuit model voltage curve $C_{model\_1}$ in the range having linear voltage characteristics.

In step S450, the control unit 120 estimates capacitance of the capacitor 230 based on a time constant τ and the estimated resistance value $R_2$ of the second resistor 220. The estimated capacitance may be equal to a value obtained by dividing the time constant τ by the estimated resistance value $R_2$ of the second resistor 220.

In step S460, the control unit 120 associates the resistance value of the first resistor 210 and the resistance value of the second resistor 220 estimated in the step S440 with the parameter estimation condition, and records it in the parameter map stored in the memory 110. Of course, in step S460, the control unit 120 may associate the capacitance estimated in the step S450 with the specific temperature, the specific SOC and the specific constant current, and record it in the parameter map.

(a) of FIG. 6 is a graph showing pulse discharge profiles obtained through pulse discharge testing of six batteries with the same maximum capacity of 36 Ah and different SOCs of 10%, 20%, 30%, 40% and 50% while maintaining the temperature at 25° C., (b) of FIG. 6 is a graph showing resistance variation profiles obtained from the pulse discharge profiles shown in (a) of FIG. 6, FIG. 7 is a graph showing candidate voltage values determined based on pulse discharge profiles and resistance variation profiles obtained in various temperature conditions, and FIG. 8 is a graph showing changes in threshold voltage with changes in temperature condition.

In each of a plurality of preset temperature conditions, a plurality of pulse discharge profiles may be obtained by conducting pulse discharge tests at each SOC, and (a) of FIG. 6 shows five pulse discharge profiles obtained under the temperature condition of 25° C.

The constant current applied in each pulse discharge test is a threshold current corresponding to the SOC and the temperature of the battery. A threshold current corresponding to a specific SOC and a specific temperature may be determined through the Hybrid Pulse Power Characterization (HPPC) method or the like, and may be the maximum value of discharge current that does not damage the battery.

Preferably, when the maximum value of discharge current determined through the HPPC method at the specific SOC and the specific temperature is greater than a given upper limit of discharge current for safety of the battery, the threshold current corresponding to the specific SOC and the specific temperature may be set as being equal to the upper limit of discharge current.

In the pulse discharge testing conducted to obtain the pulse discharge profiles shown in (a) of FIG. 6, the upper limit of discharge current is set to 360 A. In (a) of FIG. 6, the threshold current applied when obtaining each pulse discharge profile is indicated at the upper right part of the graph. That is, the threshold currents corresponding to 20%, 30%, 40% and 50% SOC are equally 360 A. This is because the maximum value of discharge current determined through the HPPC method for the batteries at 20%, 30%, 40% and 50% SOC in the temperature condition of 25° C. exceeds the upper limit 360 A of discharge current. In contrast, as the maximum value 200 A of discharge current determined through the HPPC method for the battery at 10% SOC in the temperature condition of 25° C. is lower than the upper limit 360 A of discharge current, 200 A is applied as the threshold current.

Each resistance variation profile may be obtained from each pulse discharge profile using the following Equation 2.

$$\frac{dR}{dt} = \frac{d\left(\frac{V(t) - V_{ocv}}{I_{TH}}\right)}{dt} \qquad <\text{Equation 2}>$$

In Equation 2, t may be the time, $I_{TH}$ may be the threshold current corresponding to the specific SOC and the specific temperature, V(t) may be the terminal voltage of the battery at t, and $v_{ocv}$ may be the OCV of the battery corresponding to the specific SOC and the specific temperature. $I_{TH}$ and $v_{ocv}$ are a given value corresponding to the specific SOC and the specific temperature, and V(t) is a value that may be extracted from the pulse discharge profile for the specific SOC and the specific temperature.

After determining time points at which each resistance variation profile reaches a preset threshold variation $R_{TH}$, voltage values of each pulse discharge profile at the determined time points are recorded as candidate voltage values. Accordingly, a plurality of candidate voltage values may be recorded in each temperature condition.

Referring to (a) and (b) of FIG. 6, five candidate voltage values related to each of pulse discharge profiles obtained at each of five SOCs in the temperature condition of 25° C. may be recorded. In detail, referring to (b) of FIG. 6, five resistance variation profiles reach the threshold variation $R_{TH}$ at five time points $t_1, t_2, t_3, t_4$ and $t_5$ in a sequential order. That is, when the threshold variation $R_{TH}$ is given, the time points at which each resistance variation profile reaches the threshold variation $R_{TH}$ may be determined. Subsequently, the terminal voltages of each pulse discharge profile shown in (a) of FIG. 6 at the five determined time points $t_1, t_2, t_3, t_4$ and $t_5$ may be determined.

Referring to FIG. 7, candidate voltage values recorded under each of various temperature conditions of 45° C., 25° C., 10° C., 0° C. and −10° C. are shown. To help understanding, candidate voltage values recorded in the same temperature condition are grouped by sequentially connecting them with a straight line. Referring to (a) and (b) of FIG. 6 together, the candidate voltage value at the time point $t_3$ is highest among the five candidate voltage values determined in the temperature condition of 25° C. Accordingly, in the temperature condition of 25° C., the candidate voltage value at the time point $t_3$ may be set as the threshold voltage.

In the same way, threshold voltages for each of the remaining temperature conditions 45° C., 10° C., 0° C. and −10° C. shown in FIG. 7 may be set, and this can be seen through FIG. 8. As shown in FIG. 8, the threshold voltage may tend to increase as the temperature increases. The threshold voltages for temperatures other than the temperatures used in the pulse discharge testing may be set using interpolation or the like.

The operation of setting the threshold voltage of the battery based on the SOC and temperature condition described above with reference to FIGS. 6 to 8 may be performed by the control unit 120. That is, when at least one pulse discharge profile for a specific temperature condition is provided from the memory 110 or the like, the control unit 120 may determine time points at which resistance variation profiles corresponding to each pulse discharge profile reach the threshold variation $R_{TH}$, record voltages of each pulse discharge profile at the determined time points as candidate voltage values, and set any one of the candidate voltage values recorded in the same temperature condition as the threshold voltage. Of course, the threshold voltages for each temperature condition may be pre-stored in the memory 110 in the form of a lookup table.

The embodiments of the present disclosure described hereinabove are not implemented only through the apparatus and method, and may be implemented through programs that perform functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited to the above-described embodiments and the accompanying drawings, and each embodiment may be selectively combined in part or in whole to allow various modifications.

What is claimed is:

1. A method for estimating parameters of a battery equivalent circuit model, the battery equivalent circuit model including a first resistor, a second resistor connected in series to the first resistor, and a capacitor connected in parallel to the second resistor, the method comprising:
   setting a parameter estimation condition including:
      a specific temperature;
      a specific state of charge (SOC); and
      a specific constant current;
   reading a pulse discharge profile corresponding to the parameter estimation condition from a plurality of pre-stored pulse discharge profiles, the pulse discharge profile including a first number of terminal voltages sequentially measured from a battery having the specific SOC in a predetermined cycle while the battery is discharged with the specific constant current from an open-circuit voltage (OCV) corresponding to the specific SOC to a lower limit of discharge voltage at the specific temperature;
   determining a threshold voltage between the OCV and the lower limit of discharge voltage from the pulse discharge profile;
   extracting a second number of terminal voltages between the OCV and the threshold voltage from the first number of terminal voltages;
   estimating a resistance value of the first resistor and a resistance value of the second resistor based on:
      the OCV;
      the specific constant current; and
      the second number of terminal voltages;
   recording the estimated resistance value of the first resistor and the estimated resistance value of the second resistor in a parameter map by associating the estimated resistance value of the first resistor and the estimated resistance value of the second resistor with the parameter estimation condition; and
   controlling the battery by using the parameter map.

2. The method for estimating parameters of a battery equivalent circuit model according to claim 1, wherein the estimating the resistance value of the first resistor and the resistance value of the second resistor comprises estimating the resistance value of the first resistor and the resistance value of the second resistor based on the OCV, the specific constant current, and the second number of terminal voltages, using a least square algorithm.

3. The method for estimating parameters of a battery equivalent circuit model according to claim 1, further comprising determining capacitance of the capacitor based on a time constant and the estimated resistance value of the second resistor.

4. The method for estimating parameters of a battery equivalent circuit model according to claim 1, further comprising:
   associating the estimated resistance value of the first resistor and the estimated resistance value of the second resistor with the specific temperature, the specific SOC, and the specific constant current; and
   recording the associated estimated resistance value of the first resistor and the associated estimated resistance value of the second resistor in the parameter map.

5. A non-transitory recording medium having recorded thereon a program for performing the method according to claim 1 in a computer.

6. An apparatus for estimating parameters of a battery equivalent circuit model, the battery equivalent circuit model including a first resistor, a second resistor connected in series to the first resistor, and a capacitor connected in parallel to the second resistor, the apparatus comprising:
   a memory configured to store a plurality of pulse discharge profiles; and
   a control unit operably coupled to the memory, the control unit being configured to:
      set a parameter estimation condition including:
         a specific temperature;
         a specific state of charge (SOC); and
         a specific constant current,
      read a pulse discharge profile corresponding to the parameter estimation condition from the plurality of pulse discharge profiles, the pulse discharge profile including a first number of terminal voltages sequentially measured from a battery having the specific SOC in a predetermined cycle while the battery is discharged with the specific constant current from an open-circuit voltage (OCV) corresponding to the specific SOC to a lower limit of discharge voltage at the specific temperature;
      determine a threshold voltage between the OCV and the lower limit of discharge voltage from the pulse discharge profile;
      extract a second number of terminal voltages between the OCV and the threshold voltage from the first number of terminal voltages;
      estimate a resistance value of the first resistor and a resistance value of the second resistor based on:
         the OCV;
         the constant current; and
         the second number of terminal voltages;
      record the estimated resistance value of the first resistor and the estimated resistance value of the second resistor in a parameter map by associating the estimated resistance value of the first resistor and the estimated resistance value of the second resistor with the parameter estimation condition; and
      control the battery by using the parameter map.

7. The apparatus for estimating parameters of a battery equivalent circuit model according to claim 6, wherein the control unit is further configured to estimate the resistance value of the first resistor and the resistance value of the second resistor based on the OCV, the specific constant current, and the second number of terminal voltages, using a least square algorithm.

* * * * *

UNITED STATES PATENT AND TRADEMARK OFFICE
CERTIFICATE OF CORRECTION

PATENT NO. : 11,119,157 B2  
APPLICATION NO. : 16/610208  
DATED : September 14, 2021  
INVENTOR(S) : Young-Jin Kim et al.

Page 1 of 1

It is certified that error appears in the above-identified patent and that said Letters Patent is hereby corrected as shown below:

On the Title Page

Column 1, Item (22) should read:  
--(22) PCT Filed: October 11, 2018--.

Signed and Sealed this  
Twenty-first Day of March, 2023

Katherine Kelly Vidal  
*Director of the United States Patent and Trademark Office*